United States Patent
Iida et al.

[19]

[11] Patent Number: 6,050,389

[45] Date of Patent: Apr. 18, 2000

[54] CARRIER APPARATUS WITH MORE THAN ONE CARRIER BELTS AND PROCESSING APPARATUS THEREWITH

[75] Inventors: Naruaki Iida; Seiji Kozawa, both of Kumamoto, Japan

[73] Assignee: Tokyo Electron Limited, Tokyo, Japan

[21] Appl. No.: 09/118,830

[22] Filed: Jul. 20, 1998

[30] Foreign Application Priority Data

Jul. 28, 1997 [JP] Japan ................................. 9-218018

[51] Int. Cl.$^7$ .................................................. B65G 43/00
[52] U.S. Cl. .................. 198/341.01; 198/464.4; 198/468.6; 414/222.02; 414/937; 474/102
[58] Field of Search .................. 198/464.4, 468.6, 198/468.8, 810.02–810.04, 750.14, 751, 341.01; 414/222.02, 222.09, 222.13, 937, 222.12; 474/102, 106, 109

[56] References Cited

U.S. PATENT DOCUMENTS

| | | | |
|---|---|---|---|
| 3,956,632 | 5/1976 | Hall et al. ........................... | 198/810.03 |
| 3,963,115 | 6/1976 | Teske et al. ........................ | 198/810.02 |
| 4,462,523 | 7/1984 | Kerr .................................... | 198/810.02 |
| 4,657,131 | 4/1987 | Brychta et al. .................... | 198/810.02 |
| 5,096,044 | 3/1992 | Biebel ................................. | 198/810.03 |
| 5,664,254 | 9/1997 | Ohkura et al. . | |

FOREIGN PATENT DOCUMENTS

8-274143  10/1996  Japan .
10-189686  7/1998  Japan .

*Primary Examiner*—Jospeh E. Valenza
*Attorney, Agent, or Firm*—Oblon, Spivak, McClelland, Maier & Neustadt, P.C.

[57] ABSTRACT

A carrier apparatus is provided with a first carrier mechanism, a second carrier mechanism, and a sensor. The first carrier mechanism has a holding portion holding a substrate, a driving pulley, an idler pulley, and a first endless belt, the first endless belt being provided between the driving pulley and the idler pulley and the holding portion being attached to the first endless belt. The second carrier mechanism has a driving source with a rotation output shaft, a speed reducing pulley fixed on the driving pulley and more than one second endless belts, the above more than one second endless belts being provided between the rotation output shaft and the speed reducing pulley. A sensor detects the state of the second endless belt, for example, the occurrence of cutting. As a result, even if the state of a carrier belt deteriorates, the holding portion is prevented from falling.

21 Claims, 9 Drawing Sheets

CARRIER APPARATUS WITH MORE THAN ONE CARRIER BELTS AND PROCESSING APPARATUS THEREWITH

BACKGROUND OF THE INVENTION

This invention relates to a carrier apparatus applied to a coating and developing apparatus, for example, for coating a wafer with a resist and developing it, and a processing apparatus provided with the carrier apparatus.

In a photo-resist process of a semiconductor device fabrication, a resist solution is coated on a surface of a substrate such as a semiconductor wafer (referred to as "a wafer" hereinafter) to form a resist film. After the predetermined pattern is exposed on the resist film, the substrate is coated with a developing solution and developed. A coating and developing apparatus is used so far in a series of the processes.

The coating and developing apparatus is provided with processing units which individually perform a series of processes necessary for coating and developing, that is, an adhesion unit, a coating unit, a thermal processing unit, a developing unit and the like. An adhesion unit performs adhesion treatment to improve resist fixing. A coating unit coats a substrate with resist solution. A thermal processing unit heats a substrate coated with resist solution to cure the resist film. Another thermal processing unit heats a exposed substrate at the predetermined temperature. The developing unit develops a exposed substrate.

A carrier apparatus is used for carrying a wafer between each processing unit or carrying a wafer in/out from each processing unit, the carrier apparatus, for example, being able to carry a wafer while holding it.

Recently, a coating and developing apparatus provided with the processing units which are vertically multi-tiered is proposed in order to save an installation space. A carrier apparatus used in this type of coating and developing apparatus needs rapid vertical movement and easy stop control. Needless to say, it is required to minimize the occurrence of dust and take it into consideration not to adhere occurring particles to a wafer.

Thus, a conventional carrier apparatus has the structure described hereinafter. That is, an idler pulley and a driving pulley are disposed vertically. A timing belt is provided between the idler pulley and the driving pulley. A holding portion for holding a wafer is attached to the timing belt through a proper attaching member. A motor with a strong possibility of occurrence of dust is disposed below. A speed reducing belt is provided between an output shaft of the motor and a speed reducing pulley with larger diameter which is disposed on the same shaft as the driving pulley. From the above structure, the timing belt moves vertically by normal rotation and reverse rotation of the output shaft of the motor, whereby the holding portion moves vertically.

BRIEF SUMMARY OF THE INVENTION

A speed reducing belt is, however, faster in moving speed than a timing belt because a speed reducing pully is larger in size than other pulleys. Therefore, the speed reducing belt deteriorates faster than the timing belt, whereby the reducing belt is easier to be cut.

A conventional carrier apparatus has one speed reducing belt so that a holding portion may fall if the speed reducing belt is cut. Moreover, it is difficult that a thick and strong timing belt is hung on the speed reducing pulley in a limited space within the carrier apparatus.

The present invention is provided in view of the aforethe disadvantages.

An object of the present invention is to provide a carrier apparatus which can prevent a holding portion from falling even if the state of a carrier belt deteriorates and a processing apparatus therewith.

Another object of the present invention is to provide a carrier apparatus which can take swift measures against a deteriorating belt even if the state of a carrier belt deteriorates and a processing apparatus therewith.

To attain the above-described objects, a carrier apparatus in the present invention comprises a holding portion for holding a substrate, a first carrier mechanism having a driving pulley, an idler pulley, and a first endless belt, the first endless belt being provided between the driving pulley, the idler pulley and the holding portion being attached to the first endless belt, a second carrier mechanism having a driving source with a rotation output shaft, a speed reducing pulley fixed on the driving pulley and more than one second endless belts, the aforethe more than one second endless belts being provided between the rotation output shaft and the speed reducing pulley, and first detecting means for detecting the state of the second endless belts.

A processing apparatus in the present invention comprises a processing unit group provided with multi-tiered processing units for performing the predetermined treatments on a substrate, a holding portion for sending and receiving the substrate to/from each of the processing units, a first carrier mechanism having a driving pulley, an idler pulley, and a first endless belt, the first endless belt being provided between the driving pulley and the idler pulley and the holding portion being attached to the first endless belt, a second carrier mechanism provided with a driving source having a rotation output shaft, a speed reducing pulley fixed to the driving pulley, and more than one second endless belts, the above more than one second endless belts being provided between the rotation output shaft and the speed reducing pulley, and detecting means for detecting the state of the second endless belts.

According to the present invention, even if the state of one endless belt, for example, out of more than one second endless belts deteriorates to result in cutting, a stretch and the like, the existence of other second endless belts prevents a holding portion from falling. Moreover, owing to means for detecting the deteriorating state of the second endless belt, it is possible to take swift measures against the deteriorating second endless belt.

The above-described objects and still other objects and advantages of the present invention will become apparent upon reading the following specification when taken in conjunction with the accompanying drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Certain terminology will be used in the following description for convenience in reference only and will not be limiting. The word "up", "down", "right" and "left" will designate directions in the drawings to which reference is made. The word "in" and "out" will refer to directions toward and away from, respectively, the geometric center of the device and designated parts thereof. Such terminology will include derivatives and words of similar import.

Figure 1:
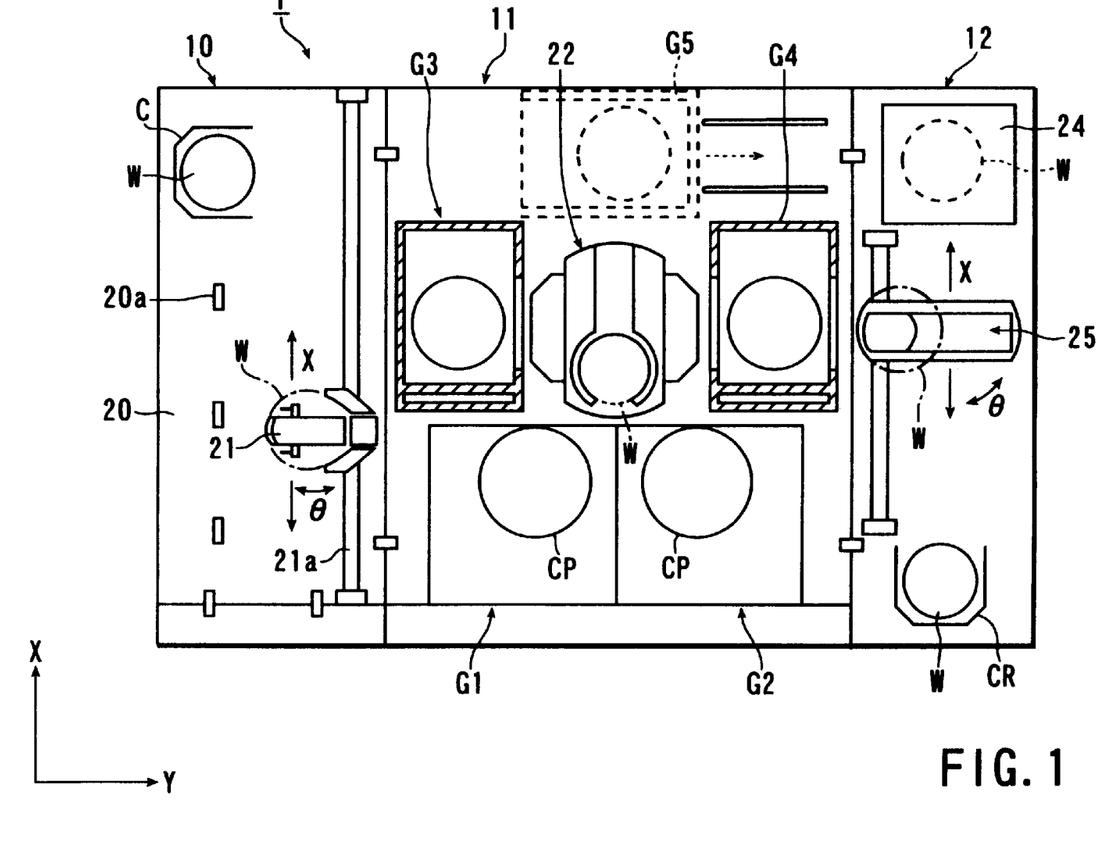
FIG. 1 is a plane view of a coating and developing apparatus according to an embodiment of the present invention.
Figure 2:
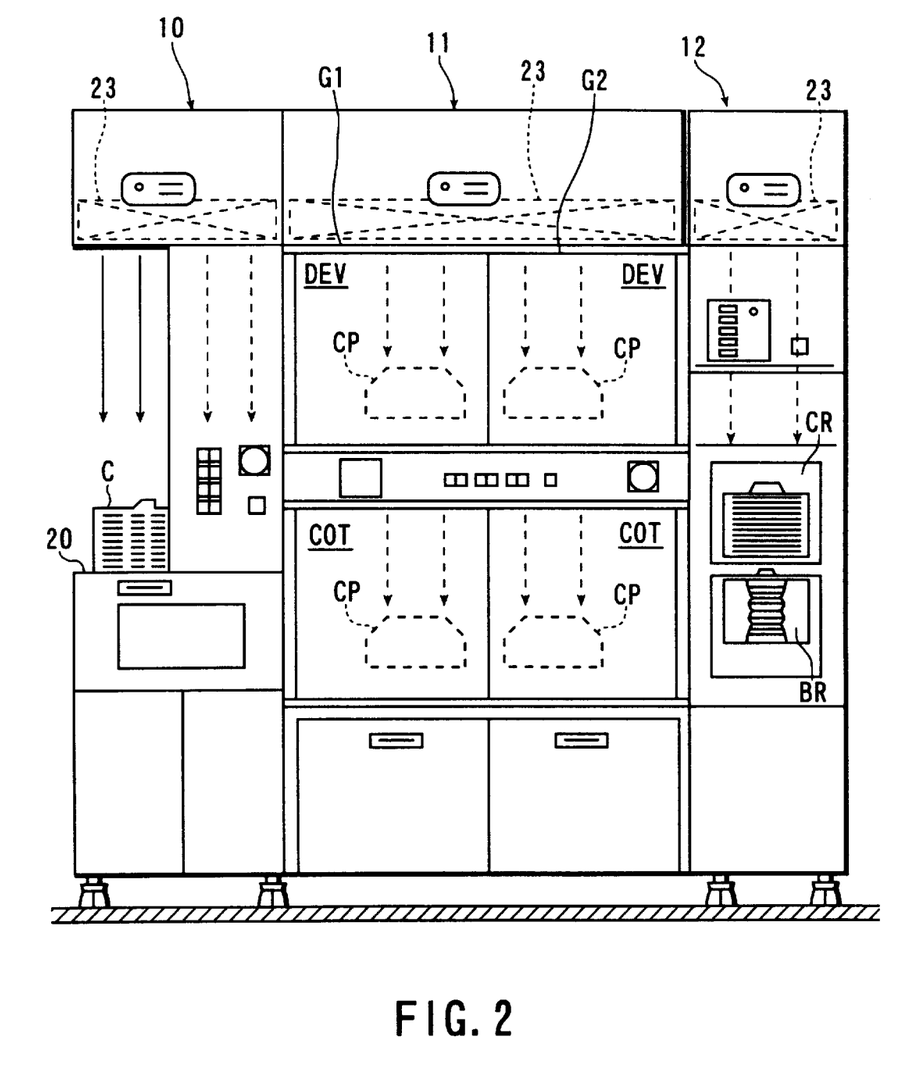
FIG. 2 is a front view of the coating and developing apparatus shown in FIG. 1.
Figure 3:
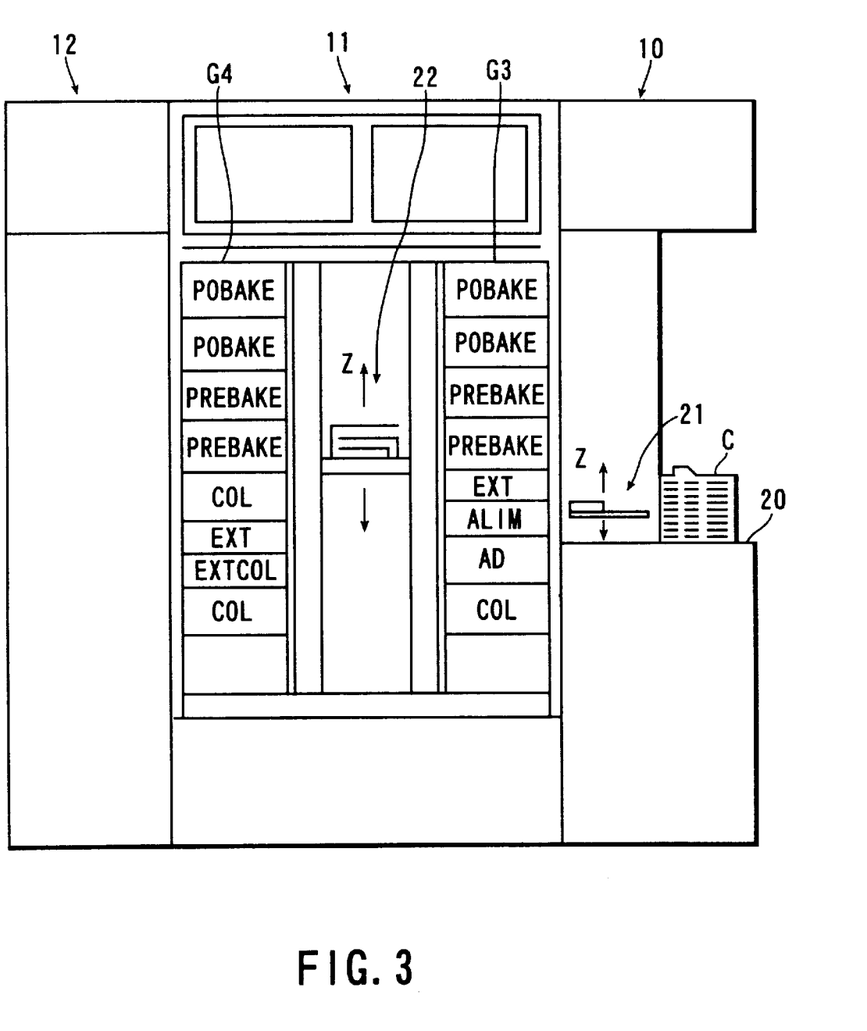
FIG. 3 is a rear view of the coating and developing apparatus shown in FIG. 1.

As shown in FIG. 1 to FIG. 3, a coating and developing apparatus 1 is provided with a cassette station 10, a process station 11 and an interface unit 12, all of which are integrally connected. In the cassette station 10, more than one wafer W, for example, twenty-five wafers per cassette C are carried in the coating and developing apparatus 1 from the outside and carried out from the coating and developing apparatus 1 to the outside. The wafer W is carried in/out from the cassette C. In the process station 11, various kinds of processing units are multi-tiered in the predetermined position. Each processing unit gives the predetermined treatment to wafers W one by one in the process of coating and developing. In the interface unit 12, the wafer W is sent and received to/from a exposing unit which is disposed adjacent to the interface unit 12.

In the cassette station 10, as shown in FIG. 1, more than one, for example, four cassettes C are disposed respectively with a way in/out for each wafer W opening to the side of the process station 11 in a line in a X-direction (vertical direction in FIG. 1) in the position of each positioning projection 20a on a cassette stand 20 where cassettes are placed. A wafer carrier 21, which can move in the direction of disposition of cassettes C (X-direction) and in a direction of disposition of wafers W (Z-direction; vertical direction) contained in the cassette C, is movable along a carrier path 21a to be selectively accessible to each cassette C.

The wafer carrier 21 is rotatable in a θ-direction and accessible to an alignment unit (ALIM) and an extension unit (EXT) which belong to a multi-tiered unit portion of a third processing unit group G3 in the side of the process station 11 as described hereinafter.

In the process station 11, as shown in FIG. 1, a carrier apparatus 22 with a vertical carrier system is placed in a center portion. Around the carrier apparatus 22, one set or more than one set of various kinds of processing units are multi-tiered so as to compose processing unit groups. In the coating and developing apparatus 1, five processing unit groups G1, G2, G3, G4 and G5 can be disposed. A first and a second processing unit groups G1 and G2 can be disposed in the front side of a system, the third processing unit group G3 can be disposed adjacent to the cassette station 10, a fourth processing unit group G4 can be disposed adjacent to the interface unit 12, and a fifth processing unit group G5 shown in a broken line can be disposed in the back side. The carrier apparatus 22 which is rotatable in a θ-direction and movable in a Z-direction can carry the wafer W in and out from each processing unit.

In the first processing unit group G1, as shown in FIG. 2, two spinner-type processing units which put a wafer W on a spin chuck in a cup CP to perform the predetermined processing, for example, a resist solution coating unit (COT) and developing unit (DEV) are dual stacked in order from the bottom. In the second processing unit group G2 just like the first processing unit group G1, two spinner-type processing units, for example, a resist solution coating unit (COT) and developing unit (DEV) are dual stacked in order from the bottom.

As shown in FIG. 2, in the upper portion of the coating and developing apparatus 1, a high efficiency filter 23 such as a ULPA filter is disposed in each of the above-described three zones, that is, the cassette station 10, the process station 11, and the interface unit 12. Particles and organic components of air supplied from above the high efficiency filter 23 are collected and removed when passing through the high efficiency filter 23. Therefore, through the high efficiency filter 23, clean air flowing downward from above is supplied to the cassette stand 20, the carrier path 21a of the wafer carrier 21, the first and the second processing unit groups Gl and G2, all of which are described above, the third to the fifth processing unit groups G3, G4 and G5 and the interface unit 12, which are described below, in the direction of a solid line arrow or a dotted line arrow.

In the third processing unit group G3, as shown in FIG. 3, oven-type processing units which put the wafer W on a stand (not shown) to perform the predetermined processing, for example, a cooling unit (COL) for cooling processing, an adhesion unit (AD) for adhesion processing to improve resist fixing, an alignment unit (ALIM) for positioning, an extension unit (EXT), a prebaking unit (PREBAKE) for heat processing before exposure, and a postbaking unit (POBAKE) are, for instance, eight-tiered in order from the bottom.

Similarly, in the fourth processing unit group G4, as shown in FIG. 3, oven-type processing units which put the wafer W on a stand (not shown) to perform the predetermined processing, for example, a cooling unit (COL) for cooling processing, an extension & cooling unit (EXTCOL) serving both as extension unit and cooling unit, an extension unit (EXT), an adhesion unit (AD), a prebaking unit (PREBAKE), and a postbaking unit (POBAKE) are, for instance, eight-tiered in order from the bottom.

As described above, the cooling unit (COL) and the extension & cooling unit (EXCOL), both requiring low processing temperature, are disposed below, and the prebaking unit (PREBAKE), the postbaking unit (POBAKE) and the adhesion unit (AD), all of three requiring high processing temperature, are disposed above, thereby reducing thermal mutual interference between units.

As shown in FIG. 1, the interface unit 12 has the same dimension in the direction of depth (X-direction) as the process station 11, but the dimension in the direction of width smaller than the process station 11. As shown in FIG. 1 and FIG. 2, a transportable pickup cassette CR and a fixed buffer cassette BR are dual tiered in the front side of the interface unit 12, and a peripheral exposing unit 24 is disposed in the back side thereof. In the transportable pickup cassette CR and the fixed buffer cassette BR, at least one dummy wafer DW which is described hereinafter stands by in advance.

In the center portion of the interface unit 12, a wafer carrier 25 is disposed. The wafer carrier 25 moves in a X-direction and in a Z-direction (vertical direction) so as to be accessible to both cassettes CR and BR, and the peripheral exposing unit 24. The wafer carrier 25 is also rotatable in a θ-direction to be accessible to the extension unit (EXT) which belongs to the fourth processing unit group G4 in the side of the process station 11, and moreover to a wafer delivery stand (not shown) in the side of the adjacent exposing unit.

The coating and developing apparatus 1 comprises the above-described three zones, that is, the cassette station 10, the process station 11, and the interface unit 12. In the coating and developing apparatus 1, the carrier apparatus 22 is disposed nearly in the center portion of the process station 11 as described above.

Figure 4:
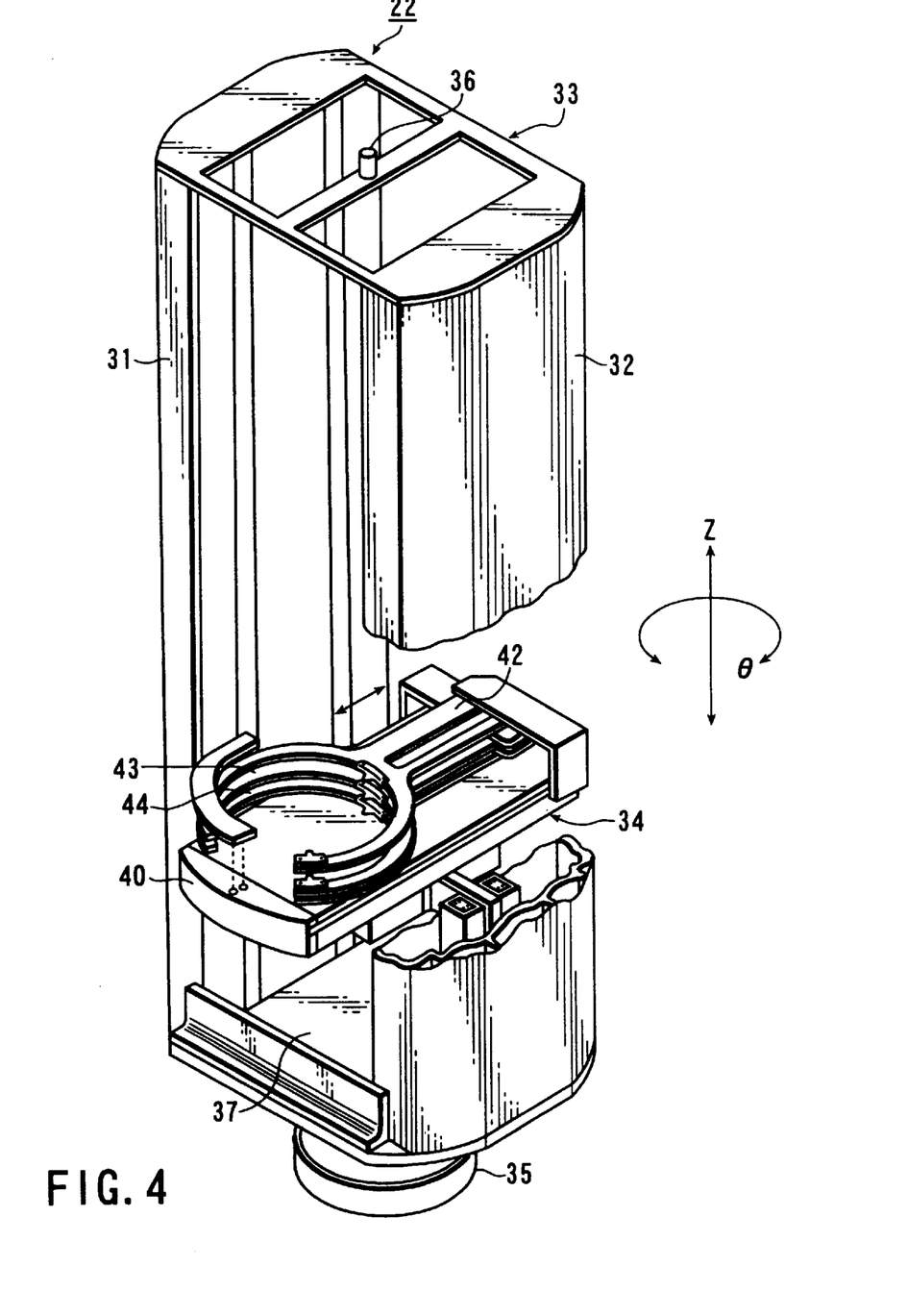
FIG. 4 is a schematic perspective view of a carrier apparatus in the coating and developing apparatus shown in FIG. 1.

As shown in FIG. 4, the carrier apparatus 22 has a carrier arm 34 serving as a holding portion for holding the wafer W inside a cylindrical supporting body 33 composed of a pair of vertical wall portions 31 and 32 disposed opposite each other of which upper end portions and lower end portions are connected each other, respectively. The carrier arm 34 is free to rise and fall vertically (in a Z-direction) as described in detail hereinafter. The cylindrical supporting body 33 is connected to a rotation shaft of a rotary drive motor 35 and rotates on a rotation center shaft 36 by rotary driving force of the rotary drive motor 35. Therefore, since the carrier arm 34 rotates with the cylindrical supporting body 33, the carrier arm 34 is rotatable in a θ-direction.

The carrier arm 34 is provided with more than one holding members, for example, three holders 42, 43, and 44, which are movable on a carrier base 40 in the direction of the front and the rear of the carrier base 40. Each of the holders 42, 43, and 44 has shape and size possible to pass through a side opening portion 37 between both the vertical wall portions 31 and 32 of the cylindrical supporting body 33, and freely moves in the above-described front and rear directions shown in a reciprocating arrow in FIG. 4 by a driving motor (not shown) built in a the carrier base 40 and a belt (not shown). The wafer W can be held by any one of the holders 42, 43, and 44. The holders 42 in the uppermost position is usually used when the process from cooling to resist coating is performed, while the holders 43 in the second tier or the holders 44 in the lowest position is used when the wafer W is carried with no possibility of being affected badly by thermal interference.

Figure 5:
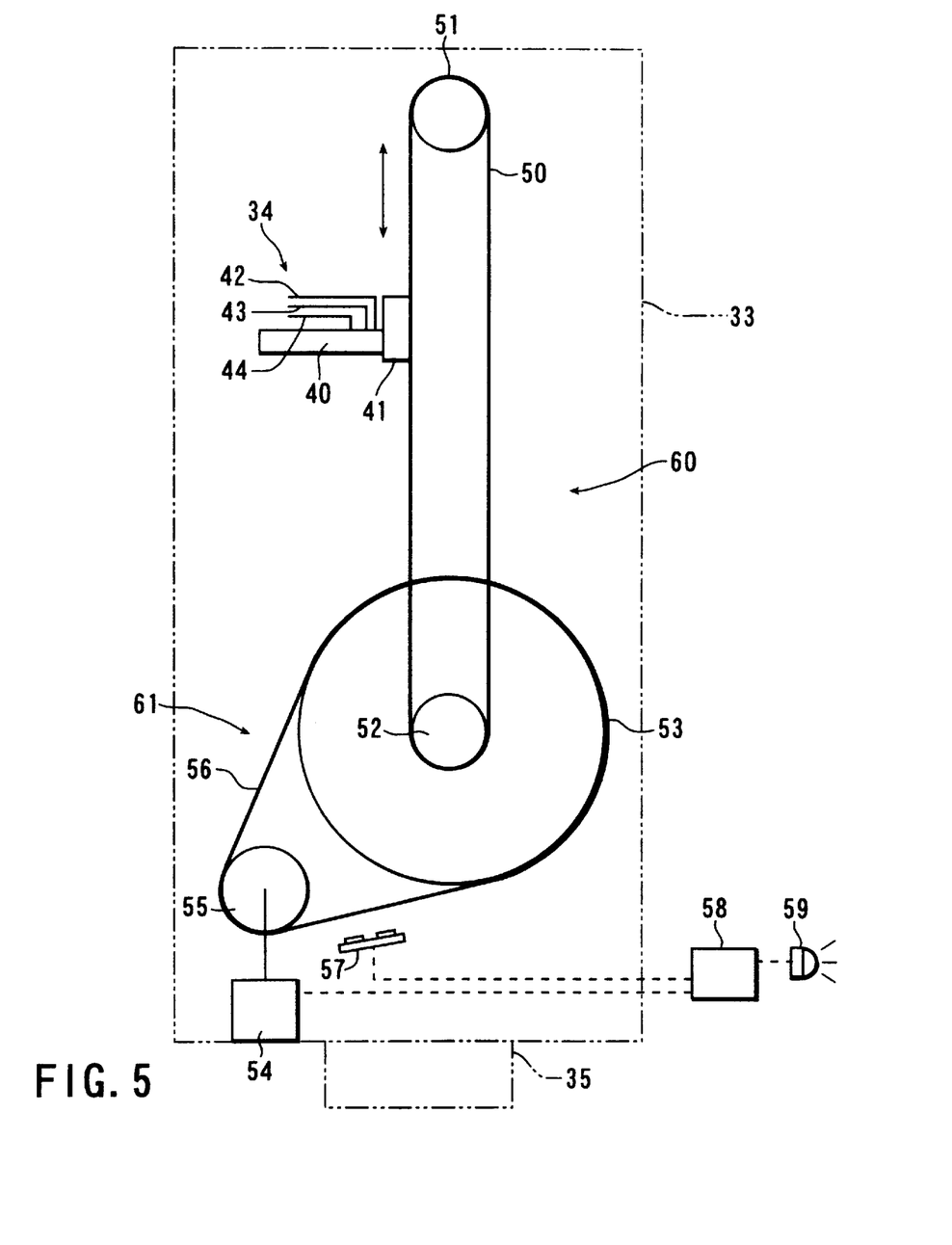
FIG. 5 is an explanatory view of a carrier apparatus according to an embodiment of the present invention.

As shown in FIG. 5, the carrier base 40 is attached to an endless timing belt 50 (a first endless belt) through an attaching member 41. The timing belt 50 is provided between an idler pulley 51 disposed in the upper position and a driving pulley 52 disposed in the lower position within the cylindrical supporting body 33. The timing belt 50, the idler pulley 51, and the driving pulley 52 compose a first carrier mechanism 60.

A speed reducing pulley 53 with larger diameter than the driving pulley 52 is disposed on the same shaft as the driving pulley 52. Between the speed reducing pulley 53 and a rotation output shaft 55 of a motor 54, for example, two speed reducing belts 56 and 56 (a second endless belt) are provided. The speed reducing pulley 53, the motor 54, and the speed reducing belt 56 compose a second carrier mechanism 61.

The speed reducing belt 56 is formed of a material of almost the same quality as the timing belt 50. In the carrier apparatus 22, a cutting sensor 57 is disposed to detect cutting of the speed reducing belt 56.

Figure 6:
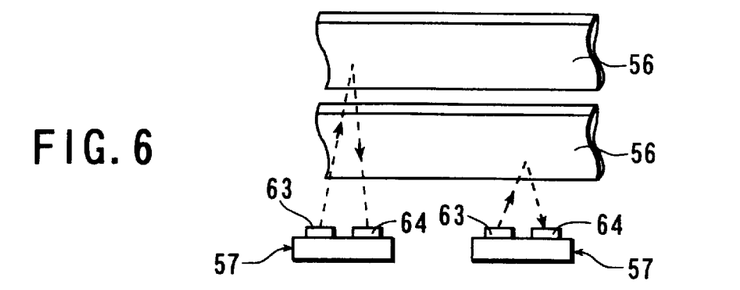
FIG. 6 is an explanatory view of a cutting sensor in the carrier apparatus shown in FIG. 5.

As shown in FIG. 6, a limit refraction-type cutting sensor is used for the cutting sensor 57. One cutting sensor 57 is provided for one speed reducing belt 56, respectively. The cutting sensor 57 is provided with a light emitting unit 63 for emitting detecting light and a light receiving unit 64 for receiving reflected light after the detecting light reflects on the surface of the speed reducing belt 56. The light emitting unit 63 and the light receiving unit 64 are disposed apart from each other at the predetermined distance.

When the speed reducing belt 56 is cut, the reflected light is not detected by the light receiving unit 64, whereby the cutting of the speed reducing belt 56 can be detected. When the cutting sensor 57 detects the cutting of the speed reducing belt 56, a detection signal is sent to a control unit 58 which is disposed outside the cylindrical supporting body 33. After the detect signal is inputted to the control unit 58, the control unit 58 outputs the attention signal to a report unit 59 and at the same time outputs a stop signal to the motor 54.

In the cutting sensor 57 used in the embodiment, the distance between the light emitting unit 63 or the light receiving unit 64 and the speed reducing belt 56 is set for the predetermined value to be detected. In other words, when a distance is longer or shorter than the above value, the light receiving unit 64 can not receive the reflected light. Therefore, when the speed reducing belt 56 stretches and loosens so that the distance changes, the light receiving unit 64 no longer can receive the reflected light, whereby the cutting sensor 57 is provided with a function for detecting looseness and flapping of the speed reducing belt 56.

Next, the operation of the carrier apparatus 22 structured as above is described. As mentioned above, the speed reducing belt 56 is faster in moving speed than the timing belt 50. Thus, the speed reducing belt 56 deteriorates faster than the timing belt 50, thereby increasing a possibility of cutting of the speed reducing belt 56.

When the speed reducing belt 56 is cut, the brakes of the motor 54 is not applied to the speed reducing belt 56. Therefore, if the speed reducing belt 56 is only one as before, the carrier arm 34 falls. The carrier apparatus 22 according to the above embodiment is, however, provided with two of the speed reducing belts 56 so that the carrier arm 34 does not fall even if one of two speed reducing belts 56 is cut.

When the speed reducing belt 56 is cut, bad influences may occur, for example, the speed reducing belt 56 may twine around the other speed reducing belt 56, or dust may occur from cut surfaces and the like. However, the carrier apparatus 22 in the embodiment is provided with the cutting sensor 57. Therefore, when the speed reducing belt 56 is cut, cutting is detected by the cutting sensor 57, which can be known immediately by the report unit 59. As a result, swift measures can be taken against the cut speed reducing belt 56.

The cutting sensor 57 used in this embodiment can detect the looseness and flapping of the speed reducing belt 56, whereby the deterioration of the speed reducing belt 56 in a previous stage to cutting can be also known.

The control unit 58 sends the motor 54 a stop signal to stop the motor 54. With the signal, the motor 54 stops the operation and the rotation output shaft 55 rotated by driving force of the motor 54 also stops. Thus, the driving pulley 52 stops the rotation, thereby preventing the cut speed reducing belt 56 from giving bad influence such as from twining around other members in the carrier apparatus 22, which leads to the improvement in yield rate.

Figure 7:
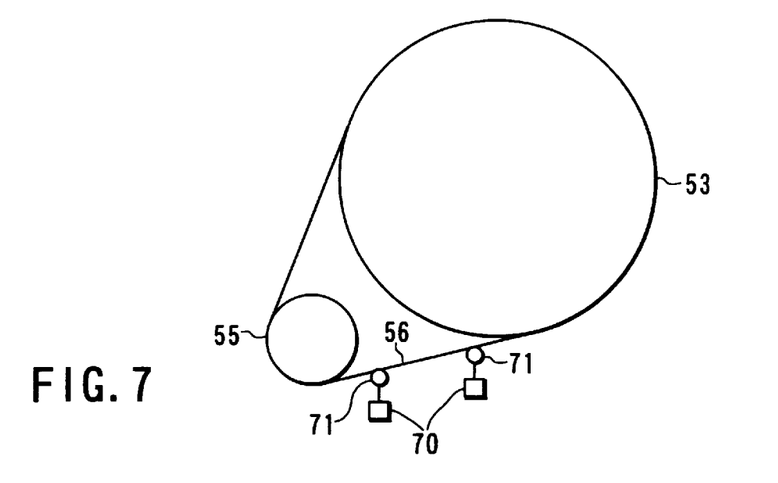
FIG. 7 is an explanatory view of a tension sensor used for the carrier apparatus shown in FIG. 5.

As described above, in the above embodiment, the cutting sensor 57 is used for detecting the cutting of the speed reducing belt 56, but instead of the cutting sensor 57, a tension sensor 70 can be used for detecting the tension of the speed reducing belt 56 as shown in FIG. 7.

Just like the cutting sensor 57, one tension sensor 70 is provided for each of speed reducing belts 56. A rotary portion 71 which rotates by being pressed by the speed reducing belt 56 is disposed on an end portion of the tension sensor 70. The rotary portion 71 of the tension sensor 70 rotates along the direction of movement of the speed reducing belt 56, while pressing the fixed force against the speed reducing belt 56. The tension sensor 70 detects the tension of the speed reducing belt 56.

Therefore, the tension sensor 70 detects the state that the speed reducing belt 56 stretches and the tension of the speed reducing belt 56 becomes weak. If the tension sensor 70 detects the reduction of the tension, the tension sensor 70 sends the fact as a detection signal to the control unit 58. The control unit 58 outputs the predetermined report signal to the report unit 59 and a stop signal to the motor 54 just like the above-described embodiment. Thus, it can be known immediately by the report unit 59 that the speed reducing belt 56 stretches, and at the same time bad influence such as the speed reducing belt 56 twining around the other speed reducing belt 56 is prevented.

Figure 8:
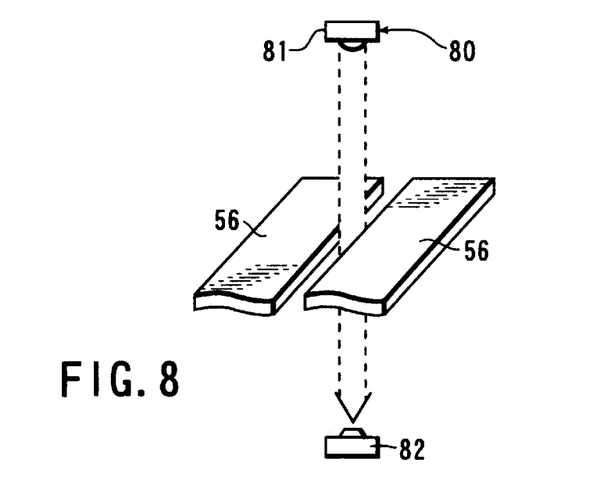
FIG. 8 is an explanatory view of a contact sensor used for the carrier apparatus shown in FIG. 5.

Instead of the cutting sensor 57 and the tension sensor 70, as shown in FIG. 8, a contact sensor 80 for detecting mutual contact of the speed reducing belts 56 can be used.

The contact sensor 80 is provided with a light emitting unit 81 and a light receiving unit 82 separately. The light emitting unit 81 and the light receiving unit 82 are vertically disposed opposite each other across the speed reducing belts 56. The light emitting unit 81 always emits a detecting light to the light receiving unit 82. The detecting light emitted from the light emitting unit 81 passes between two speed reducing belts 56 and 56 in the normal state and is received by the light receiving unit 82.

When there occurs mutual contact of the speed reducing belts 56 and 56 due to the deterioration of the speed reducing belt 56, the detecting light to be detected by the light receiving unit 82 is interrupted by the mutually contacting speed reducing belts 56. As a result, the contact sensor 80 sends the fact of the speed reducing belts 56 contacting mutually as a detect signal to the control unit 58.

Just like the above-described embodiment, when receiving the detect signal, the control unit 58 outputs the predetermined report signal to the report unit 59 and sends a stop signal to the motor 54. Thus, it is immediately confirmed by the report unit 59 that the speed reducing belts 56 contact mutually. In addition, the motor 54 sops by the stop signal from the control unit 58 so that the rotation of the rotation output shaft 55 stops resulting in a stop of the movement of the speed reducing belts 56. As a result, swift measures can be taken against the mutually contacting speed reducing belts 56.

Figure 9:
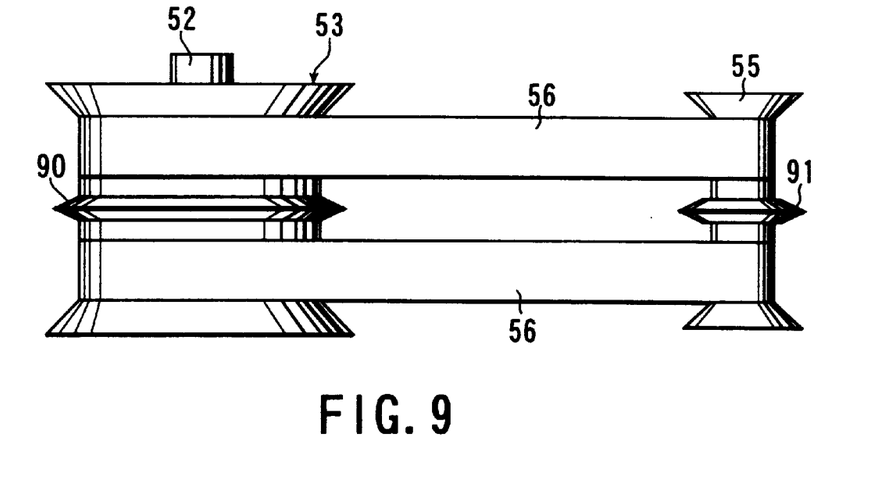
FIG. 9 is an explanatory view of guides for preventing contact disposed on a speed reducing pulley and on a rotation output shaft in the carrier apparatus shown in FIG. 5.
Figure 10:
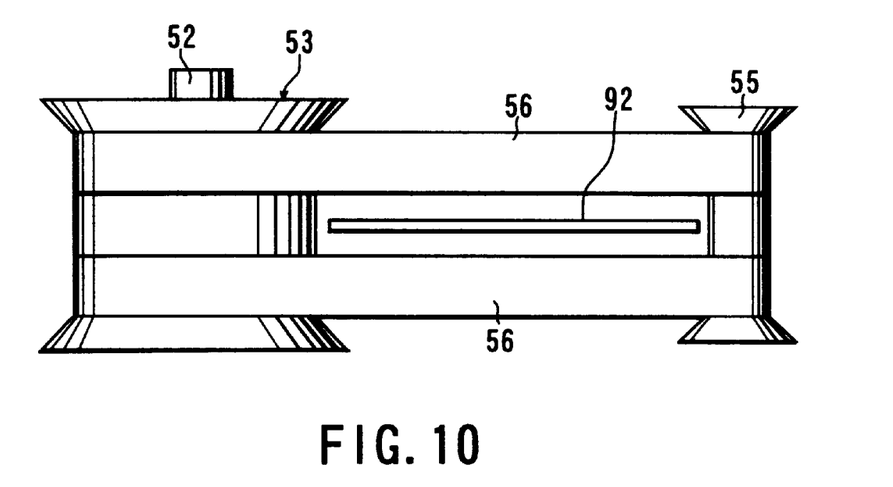
FIG. 10 is an explanatory view of the guide for preventing contact shown in FIG. 9 disposed between the speed reducing pulley and the rotation output shaft.

Moreover, in order to prevent the above-mentioned mutual contact of the speed reducing belts 56, a guide 90 for preventing contact can be disposed between each two of more than one speed reducing belts 56 as shown in FIG. 9. In other words, guides 90 and 91 are disposed between two speed reducing belts 56 and 56 on the speed reducing pulley 53 and the rotation output shaft 55. Also as shown in FIG. 10, a guide 92 can be disposed nearly in the middle between two speed reducing belts 56 and 56, and between the speed reducing pulley 53 and the rotation output shaft 55, thus preventing mutual contact of the speed reducing belts 56 and 56 and the occurrence of dust such as particles caused by the mutual contact of the speed reducing belts 56 and 56.

Next, another embodiment is described.

Figure 11:
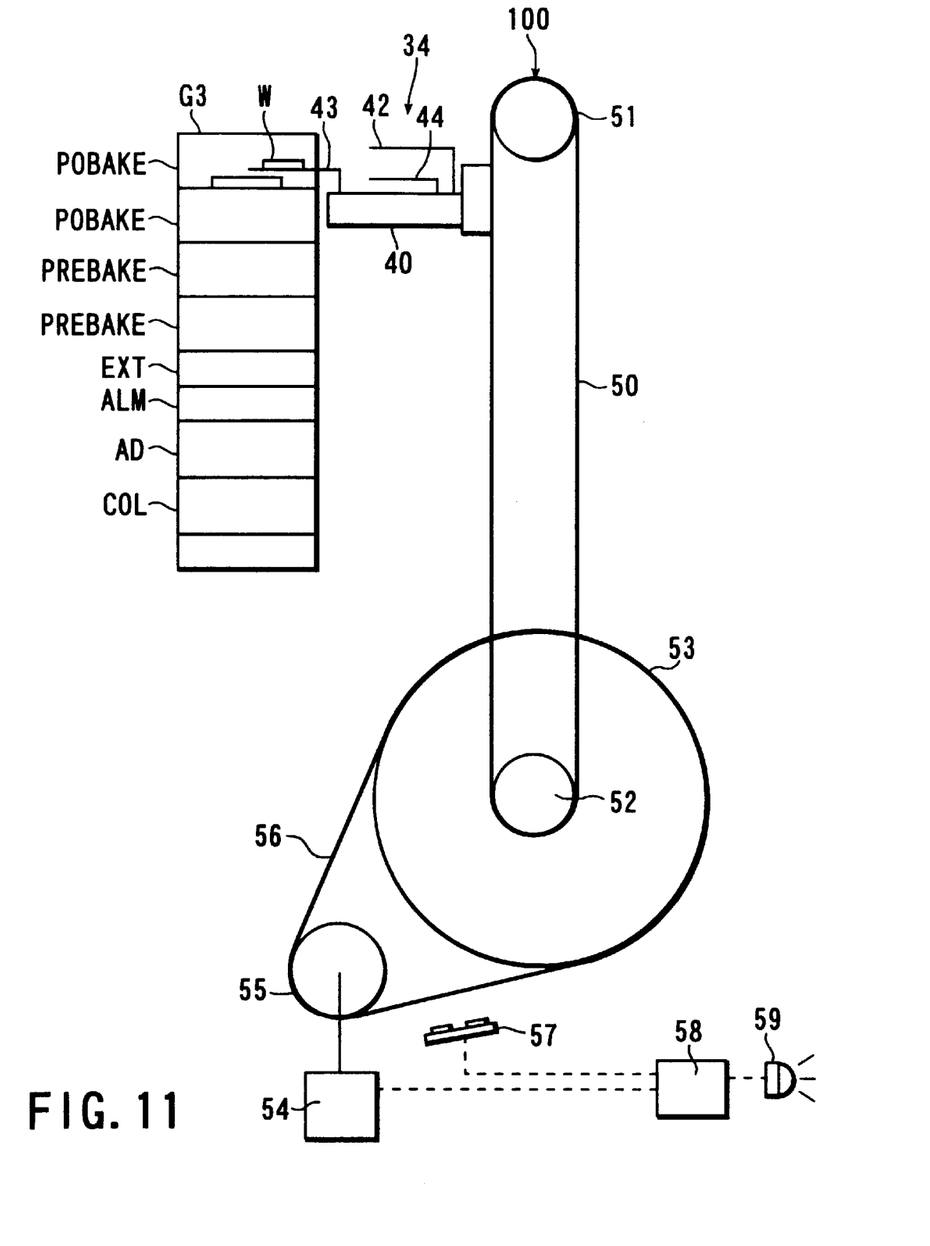
FIG. 11 is an explanatory view of the first operation of a carrier apparatus according to another embodiment.
Figure 12:
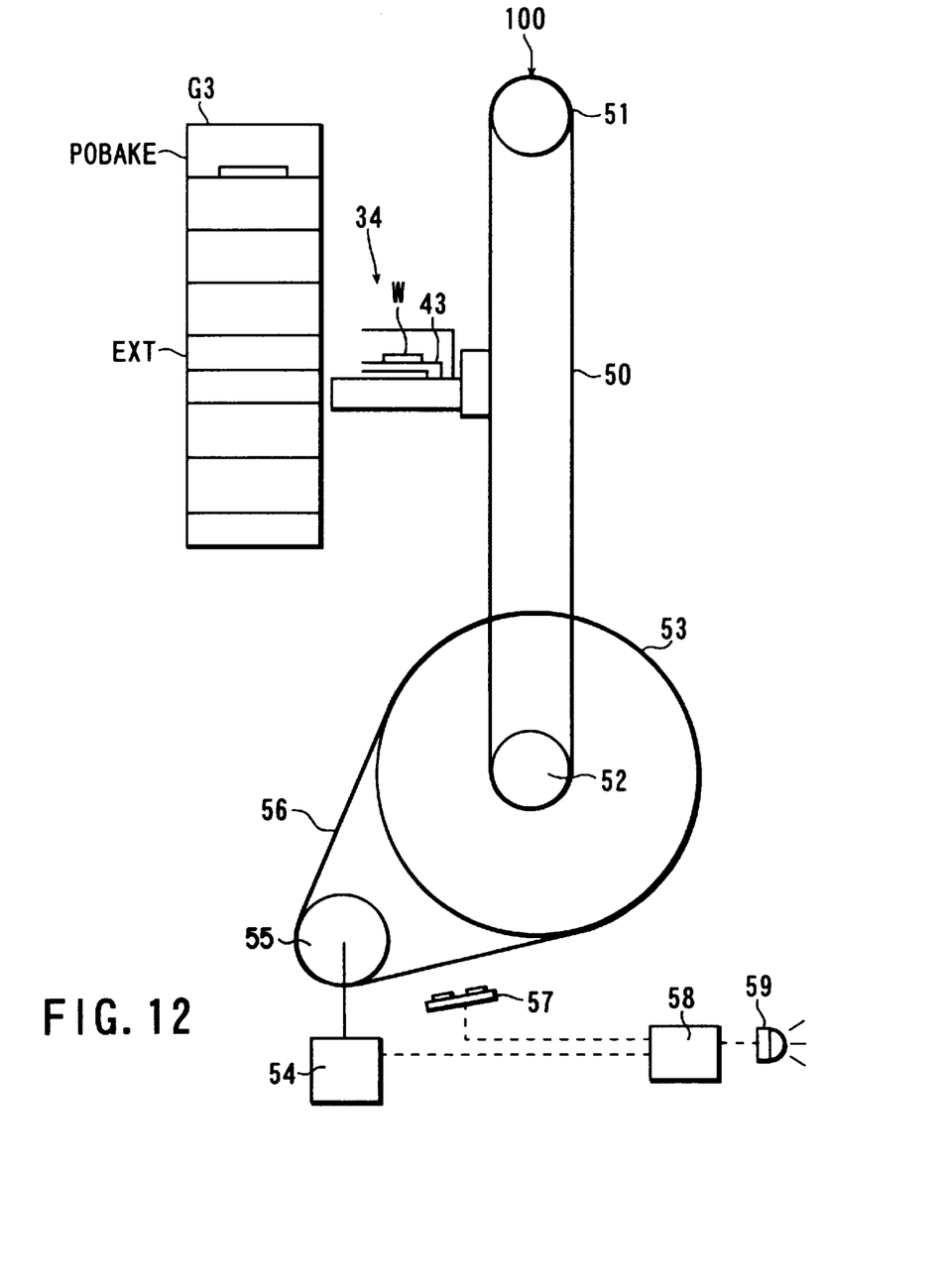
FIG. 12 is an explanatory view of the second operation of the carrier apparatus shown in FIG. 11.

As shown in FIG. 11 and FIG. 12, when one or the other of two speed reducing belts 56 is cut, for example, while the wafer W is heat-treated in the postbaking unit (POBAKE), a carrier apparatus 100 is controlled to perform the operation described hereinafter.

In other words, when the cutting sensor 57 detects the cutting of the speed reducing belt 56, the predetermined detect signal is sent from the cutting sensor 57 to the control unit 58. The control unit 58 outputs the predetermined report signal to the report unit 59 and at the same time sends a signal to the motor 54 to stop the motor 54 after carrying the wafer W out from the postbaking unit (POBAKE) with holders 42, for example, and moving the carrier arm 34 to the predetermined position by the remaining one uncut speed reducing belt 56.

Consequently, in response to the signal from the control unit 58, the motor 54 can move the timing belt 50 for the given distance by a series of rotary system members in the carrier apparatus 100 composed of the idler pulley 51, the driving pulley 52 and the speed reducing pulley 53, and the remaining one uncut speed reducing belt 56. The carrier arm 34 can move from the vicinity of the postbaking unit (POBAKE) to the predetermined position, for example, in the vicinity of the extension unit (EXT) shown in FIG. 12. Moreover, it is possible to stop the motor 54 after the carrier arm 34 moves to the predetermined position.

As described above, the carrier arm 34 can move to the predetermined position through the timing belt 50 before the motor 54 is stopped, thus preventing the state of leaving the wafer W within the postbaking unit (POBAKE), for example, which results in preventing the overheat treatment of the wafer W and securing the protection of the wafer W.

In the above-described embodiment, more than one speed reducing belts 56 are provided between the speed reducing pulley 53 and the rotation output shaft 55 of the motor 54, and in addition a cutting sensor, a tension sensor or a contact sensor is properly provided. Also as to a timing belt 50, if more than one timing belts 52 are provided between the idler pulley 51 and the driving pulley 52 and in addition a cutting sensor, a tension sensor, a contact sensor or the like is properly provided in the same way as the speed reducing belt 56 described above in consideration of the aforesaid operation effects, an expected accident caused by the cutting of the timing belt 50 itself or looseness due to deterioration can be prevented from happening.

In the above embodiments, examples of using the wafer W as a substrate are described, but the present invention is not limited to the above-described embodiments. The present invention is also applicable to a embodiment in which a LCD substrate is used.

As described above, in the present invention, more than one speed reducing belt are provided between a rotation output shaft as a driving source and a speed reducing pulley. Therefore, even if one speed reducing belt is cut, a holding portion does not fall immediately.

The reduction of tension of a speed reducing belt arising as a premonitory sign of the cutting of the speed reducing belt can be detected by a sensor. Therefore, before the stretched speed reducing belt is cut, suitable measures such as replacement of speed reducing belts can be taken.

In addition, a guide for preventing contact is disposed between speed reducing belts, thus preventing mutual contact of the speed reducing belts and the occurrence of dust in the position where the speed reducing belts contact each other.

Besides, the mutual contact of speed reducing belts arising as a premonitory sign of the cutting of the speed reducing belt can be detected by a sensor. Therefore, before any one of the mutually contacting speed reducing belts is cut, suitable measures can be taken.

Furthermore, the occurrence of any trouble such as cutting, reduction of tension and mutual contact in a speed reducing belt can be known immediately.

The occurrence of any trouble such as cutting, reduction of tension and mutual contact in a speed reducing belt can be known immediately, and at the same time a rotation output shaft as a driving source can stop. Therefore, suitable measures can be taken in advance against the speed reducing belt with the aforesaid trouble, whereby a bad influence on other members caused by the speed reducing belt with the above trouble continuing operation is prevented.

When detecting any trouble such as cutting, reduction of tension and mutual contact in a speed reducing belt, the sensor sends a detect signal of the occurrence of trouble, whereby the rotation output shaft as a driving source can stop after a holding member moves to the predetermined position. Consequently, even if any trouble arises in a speed reducing belt when a holding member stays in a processing chamber, it is prevented that a substrate under the above processing is overtreated, thus protecting the substrate.

The above-described embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A carrier apparatus comprising:
a holding portion holding a substrate;
a first carrier mechanism having a driving pulley, an idler pulley and a first endless belt, the first endless belt being provided between the driving pulley and the idler pulley, said holding portion being attached to the first endless belt;
a second carrier mechanism having a driving source with a rotation output shaft, a speed reducing pulley fixed on the driving pulley and a plurality of second endless belts, a plurality of the second endless belts being provided between the rotation output shaft and the speed reducing pulley; and
first detecting means for detecting a state of the second endless belts.

2. The apparatus as set forth in claim 1, wherein said first detecting means is provided with a sensor detecting cutting of the second endless belt.

3. The apparatus as set forth in claim 1, wherein said first detecting means is provided with a sensor detecting a stretch of the second endless belt.

4. The apparatus as set forth in claim 1, wherein said first detecting means is provided with a sensor detecting mutual contact of the adjacent second endless belts.

5. The apparatus as set forth in claim 1, further comprising a guide preventing contact disposed between the adjacent second endless belts.

6. The apparatus as set forth in claim 1, further comprising means for outputting an attention signal to a report means in accordance with a result detected by said first detecting means.

7. The apparatus as set forth in claim 1, further comprising means for stopping rotation of the rotation output shaft in accordance with a result detected by said first detecting means.

8. The apparatus as set forth in claim 1, further comprising means for stopping rotation of the rotation output shaft after moving said holding portion to a predetermined position in accordance with a result detected by said first detecting means.

9. The apparatus as set forth in claim 1, wherein said first carrier mechanism has a plurality of the first endless belts, a plurality of the first endless belts being provided between the driving pulley and the idler pulley.

10. The apparatus as set forth in claim 9, further comprising second detecting means for detecting a state of the first endless belt.

11. The apparatus as set forth in claim 10, wherein said second detecting means is provided with a sensor detecting cutting of the first endless belt.

12. The apparatus as set forth in claim 10, wherein said second detecting means is provided with a sensor detecting a stretch of the first endless belt.

13. The apparatus as set forth in claim 10, wherein said second detecting means is provided with a sensor detecting mutual contact of the adjacent first endless belts.

14. The apparatus as set forth in claim 10, further comprising a guide preventing contact disposed between the adjacent first endless belts.

15. The apparatus as set forth in claim 10, further comprising means for outputting an attention signal to a report means in accordance with a result detected by said second detecting means.

16. The apparatus as set forth in claim 10, further comprising means for stopping rotation of the rotation output shaft in accordance with a result detected by said second detecting means.

17. The apparatus as set forth in claim 10, further comprising means for stopping rotation of the rotation output shaft after moving said holding portion to a predetermined position in accordance with a result detected by said second detecting means.

18. A processing apparatus comprising:

a processing unit group having multi-tiered processing units performing predetermined processes on a substrate;

a holding portion sending and receiving the substrate to/from each of the processing units;

a first carrier mechanism having a driving pulley, an idler pulley, and a first endless belt, the first endless belt being provided between the driving pulley and the idler pulley, said holding portion being attached to the first endless belt;

a second carrier mechanism having a driving source with a rotation output shaft, a speed reducing pulley fixed to the driving pulley, and a plurality of second endless belts, a plurality of the second endless belts being provided between the rotation output shaft and the speed reducing pulley; and detecting means for detecting a state of the second endless belts.

19. The apparatus as set forth in claim 18, further comprising means for controlling the driving source to shelter a substrate held by said holding portion from heat treatment in accordance with a result detected by said detecting means.

20. The apparatus as set forth in claim 18, wherein said second carrier mechanism is disposed under said first carrier mechanism.

21. The apparatus as set forth in claim 20, further comprising means for supplying clean air flowing downward.

* * * * *